США007071853B2

United States Patent
Price

(10) Patent No.: US 7,071,853 B2
(45) Date of Patent: Jul. 4, 2006

(54) METHOD OF COMPRESSING DATA PACKETS

(75) Inventor: Richard Price, Romsey (GB)

(73) Assignee: Roke Manor Research Limited, Romsey (GB)

( * ) Notice: Subject to any disclaimer, the term of this patent is extended or adjusted under 35 U.S.C. 154(b) by 296 days.

(21) Appl. No.: 10/381,719

(22) PCT Filed: Apr. 24, 2001

(86) PCT No.: PCT/EP01/04607

§ 371 (c)(1),
(2), (4) Date: Oct. 10, 2003

(87) PCT Pub. No.: WO02/27663

PCT Pub. Date: Apr. 4, 2002

(65) Prior Publication Data

US 2004/0051653 A1 Mar. 18, 2004

(30) Foreign Application Priority Data

Sep. 28, 2000 (GB) .............................. 0237669.9
Jan. 29, 2001 (GB) .............................. 0102158.3

(51) Int. Cl.
*H03M 7/40* (2006.01)
(52) U.S. Cl. .......................... 341/65; 341/67; 341/107
(58) Field of Classification Search .................. 341/65, 341/67, 107
See application file for complete search history.

(56) References Cited

U.S. PATENT DOCUMENTS

| | | | | |
|---|---|---|---|---|
| 3,701,111 A | * | 10/1972 | Cocke et al. ................. | 341/67 |
| 5,138,316 A | * | 8/1992 | Konishi ....................... | 341/67 |
| 5,696,563 A | * | 12/1997 | Rosenberg ................... | 348/699 |
| 6,040,790 A | | 3/2000 | Law | |
| 6,088,039 A | | 7/2000 | Broder et al. | |
| 6,404,931 B1 | * | 6/2002 | Chen et al. .................. | 382/239 |

OTHER PUBLICATIONS

"JPEG Huffman Decoder" IBM Technical Disclosure Bulletin, IBM Corp. NY, vol. 36, No. 5, May 1, 1993 pp. 455-458.

(Continued)

*Primary Examiner*—Peguy JeanPierre
*Assistant Examiner*—Khai M. Nguyen
(74) *Attorney, Agent, or Firm*—Crowell & Moring LLP

(57) ABSTRACT

A method of compressing data, wherein said data is in the form of discrete units, by determining an overall code specific to the units, comprising the steps of:
a) grouping the units in terms of a common behavior pattern;
b) for each said group of units, assigning a group specific code, the sizes of said group code being ordered according to the probability of the unit occurring;
c) assigning a unit identifier code which is specific to identify an individual character within the group,
the overall code comprising of the cocatenated group specific and identifier codes, characterized wherein
step c), the identifier code is of the minimum size to allow for each unit which could occur in that group to be assigned specifically.

8 Claims, 3 Drawing Sheets

OTHER PUBLICATIONS

Marks, L.L; "Improved Grouping For Huffman Encoding" IBM Technical Disclosure Bulletin, IBM Corp. NY, vol. 22, No. 5, 1979, p. 2107 (Oct., 1979).

Svanbro, K et al: "Wireless Real-Time IP Services Enabled by Header Compression" VTC 2000-Spring. 2000 IEEE 51st. Vehicular Technology Conference Proceedings. Tokyo, Japan, May 15-18, 2000 vol. 2 of 3, conf. 51, May 15, 2000 pp. 1150-1154.

Degermark, M et al: "Evaluation of CRTP Performance Over Cellular Radio Links" IEEE Personal Communications, IEEE Communications Society, US, Vo.l. 7, No. 4, Aug. 2000, pp. 20-25.

* cited by examiner

METHOD OF COMPRESSING DATA PACKETS

This application is a 371 of PCT/EP01/04607, filed Apr. 24, 2001, and is related to U.S. patent application Ser. No. 10/381,718, filed Oct. 10, 2003.

BACKGROUND OF THE INVENTION

Many digital communications systems send data in packets. These packets contain headers at the start of the data. The header comprises information relating, e.g., to the destination address of the packet, the length of the packet and the type of payload data contained inside. The header can be considered a long character comprising a string of bits.

Mobile telecom networks and the Internet are converging in terms of their functionality. It is desirable for third generation mobile handsets to understand Internet (IP or ATM) data packets directly to allow for seamless email, web browsing and multimedia services to the mobile user. Protocols such as IP are designed to run on fixed networks where bandwidth is plentiful, and so they are costly in the mobile phone environment. When used to carry speech, the overhead resulting in using IP can be up to 75% of the total network capacity, which is unacceptable for mobile networks.

One solution to this problem is to compress the IP header just before it crosses the air interface. A number of compression schemes exist for this purpose (Van Jacobson, CRTP etc.), which variously make trade-offs between efficiency, flexibility and simplicity.

Known data compression systems include the Huffman Algorithm which is discussed in detail in co-pending application. This publicly available standard is widely used in many compression schemes including "WinZip". Huffman encoding compresses a data stream one character at a time, where a character is usually one byte. The basic compression is not very efficient, but it is possible to obtain better results by applying the method recursively or by increasing the size of one character. However, this increases the processing and/or memory requirements of the algorithm.

In order to understand the invention the prior art will now be explained.

Ordinary Huffman

Huffman encoding is a publicly available compression standard used in many popular compression schemes such as "WinZip". All Huffman compressors work on a stream of characters (for example ASCII characters). The basic idea is to create a new set of compressed characters or codes, where each normal character maps onto a compressed character and vice versa. Frequently occurring, i.e. common characters, are given shorter compressed codes than rarely used characters, reducing the average size of the data stream. The compression ratio can be improved by increasing the size of one character, but at the expense of higher memory requirements. In fact the memory used when running a Huffman compressor grows exponentially with the character size, so 16-bit characters need 256 times as much memory as 8-bit characters.

FIG. 1 illustrates how ordinary Huffman works. In the example, it relates to 10 different possible characters (a set of 10 ASCII characters) as shown in single inverted commas (in general a character can be anything e.g. a byte, a header, an ASCII character etc). A prerequisite is to know, for the characters, the approximate probability of that character turning up in the data sequence, the skilled person would understand that this can be done in any appropriate way (e.g. a large stream of characters is taken and one determines how often each character appears).

In the worked example the ordinary Huffman tree needs 10 starting nodes, one for each possible character. These nodes are plotted at the top of the Huffman tree, together with the percentage chance that the character turns up in an uncompressed data-stream. The characters are ordered generally in terms of increasing probability. The space character is a very common character and put last. As shown in the figure, the box underneath each character shows the probability of occurrence. To build the tree, the two nodes with smallest probabilities are joined up to form a new node. The left-hand branch is labelled with a "1" and the right hand branch with a "0". The new node is obtained with a probability of the combined root nodes (in the first case this is 6%). This process continues until there is only one node left, at which point the tree is finished. In general, the branch with smallest probability is labelled with a '1', and the second smallest with a '0'. The sum of these two probabilities is placed in the new node. The completed Huffman tree for the worked example is shown below:

To compress a character one starts at the correct node and follow the tree down, reading off the '1's and '0's as they occur. The string of bits that this generates is the compressed character. e.g. "E" and follow the tree down to its root; this gives 0001. Thus E is represented by a 0001.

The compressed character is sometimes backwards, so E is represented by 1000. This makes it easier to decompress (because we can follow the tree up by reading the compressed character from left to right).

Similarly, to decompress a character just follow the tree up using the compressed string of bits to decide whether to branch left or right at each node. Eventually one of the original ten nodes is reached and the correct decompressed character is discovered.

As can be seen, common characters are represented by fewer bits; a "space" character is represented here by a 0.

Improved Huffman

In a well-known enhanced method of compressing a stream of characters based on Huffman, each character is assigned a group and it is the groups which are treated as characters of the conventional Huffman algorithm. The method has significantly lower memory requirements than ordinary Huffman, allowing the size of one character to be increased and hence giving a better compression ratio. The improved Huffman method also uses a "character group" rather than the characters themselves to build a tree; the groups effectively become the characters of the ordinary Huffman.

The improved Huffman tree is constructed in two stages. In the first stage the characters are divided up into groups according to a common behaviour pattern. A behaviour pattern may e.g. be the same probability, so characters are grouped according to their relative frequency.

The problem however is that in a compressed character, the Huffman code for the group must be followed by a bit pattern identifying which character within the group has been compressed. If the group does not contain a power of two characters then bit patterns are wasted, giving poorer compression efficiency. The inventors have determined a method which overcomes these problems.

It is an object of the invention to provide an improved method of compression and subsequent decompression of headers and characters of binary (or other) data units.

The inventor has determined an improved method of compression of digital data which makes use of detecting behaviour patterns in successive data blocks, which allows for efficient data compression. Behaviour patterns are defined as any form of non-randomness and may take any appropriate form e.g. repeats, counters where the counter is incremented by 1, or where data blocks alternate between a small number of values.

The inventor has developed an improved version of the Huffman method which has significantly lower memory requirements than ordinary Huffman, allowing the size of one character to be increased and hence giving a better compression ratio.

The invention comprises a method of compressing data, wherein said data is in the form of discrete units, by determining an overall code specific to the units, comprising the steps of:

a) grouping the units in terms of a common behaviour pattern;

b) for each said group of units, assigning a group specific code, the sizes of said group code being ordered according to the probability of the unit occurring;

c) assigning a unit identifier code which is specific to identify an individual character within the group, the overall code comprising of the cocatenated group specific and identifier codes, characterised wherein step c), the identifier code is of the minimum size to allow for each unit which could occur in that group to be assigned specifically.

The invention will now be described in more detail with reference to examples.

Other objects, advantages and novel features of the present invention will become apparent from the following detailed description of the invention when considered in conjunction with the accompanying drawings.

DETAILED DESCRIPTION OF THE DRAWINGS

The invention will now be described in detail with references to the following examples.

EXAMPLE 1

Figure 1:
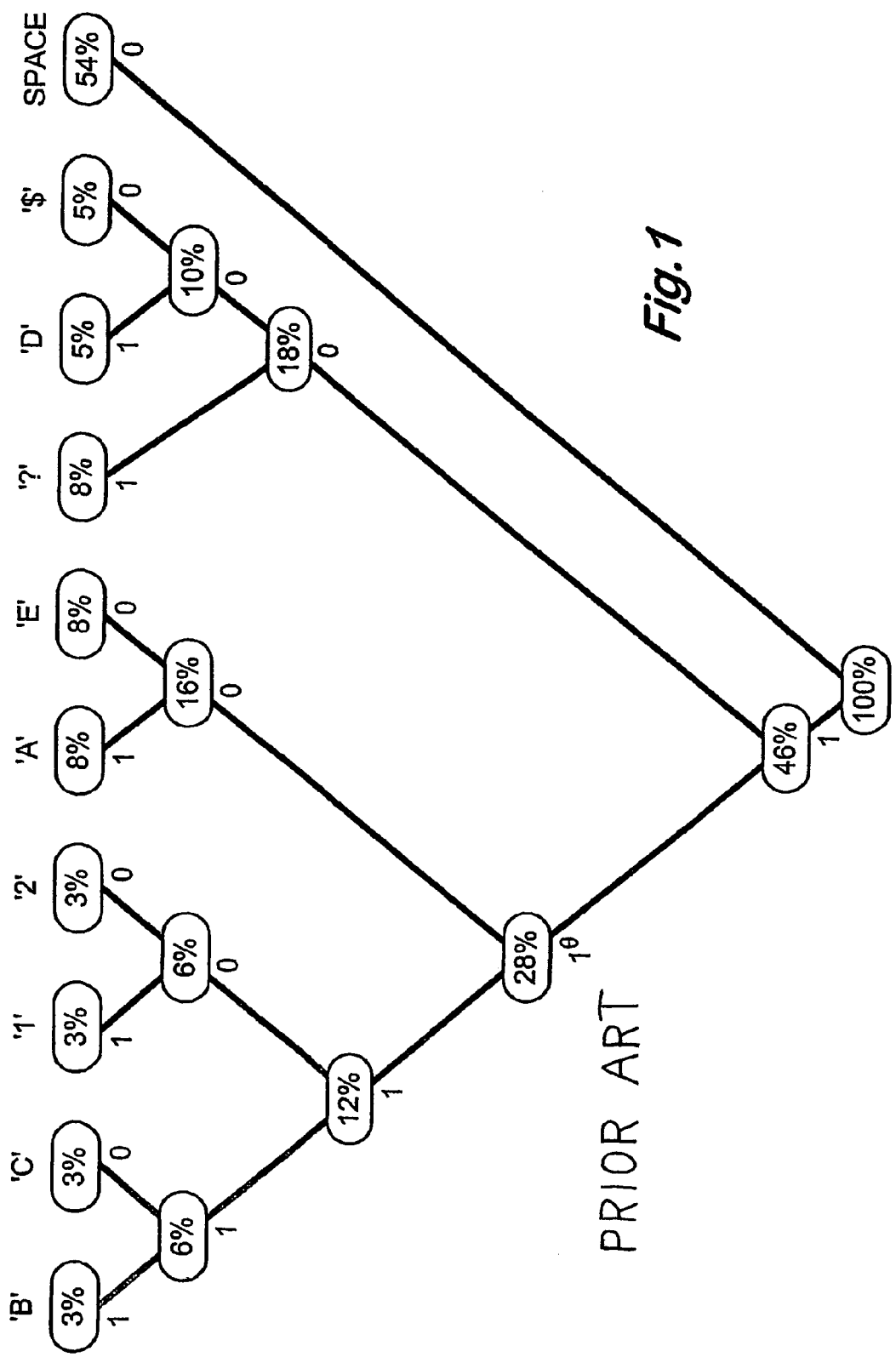
FIG. 1 is a diagram that illustrates the known ordinary Huffman compression.
Figure 2:
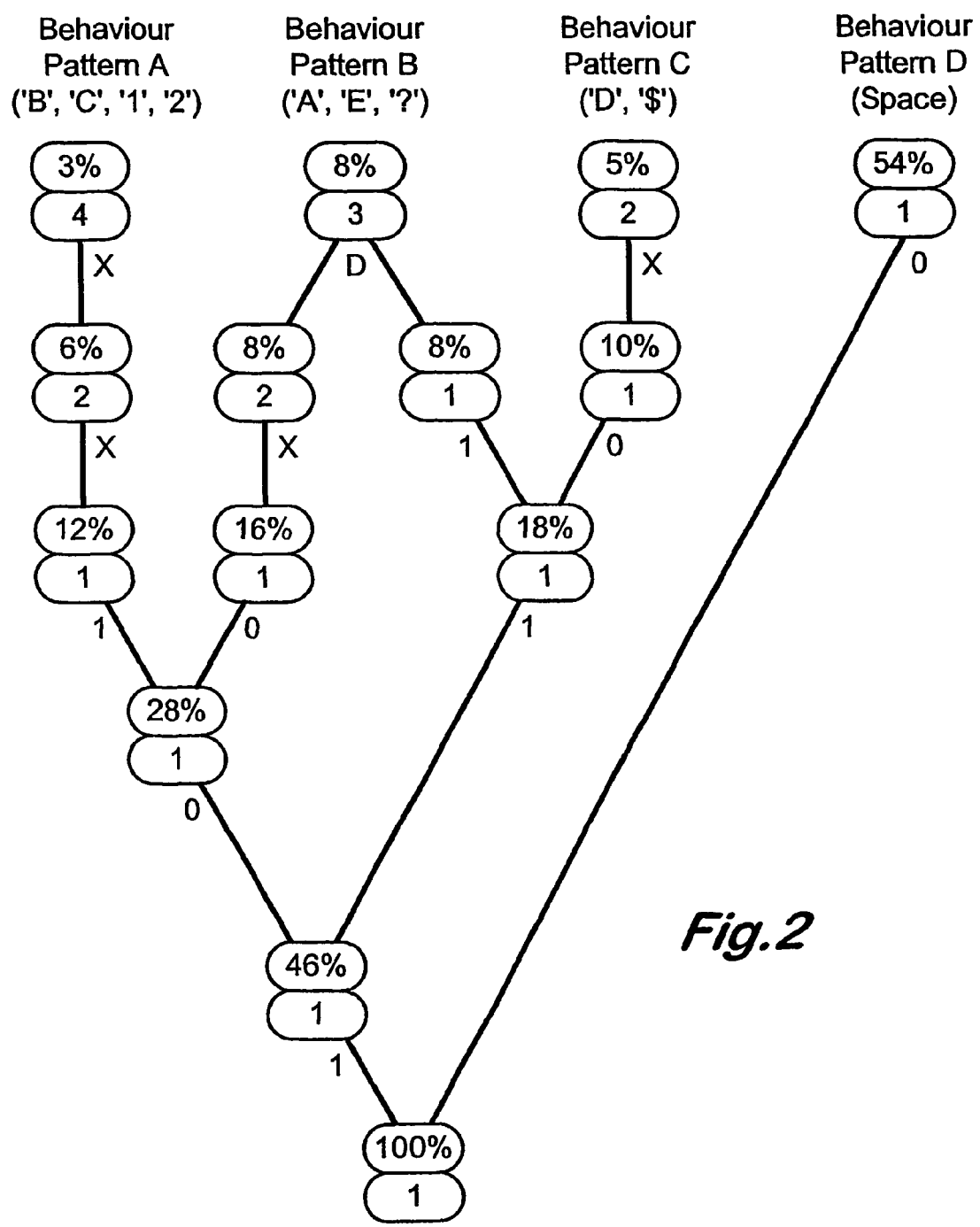
FIG. 2 is a diagrammatic depiction of data compression according to the invention.

A following simple basic example of the invention will now be described with reference to FIG. 2. In the worked example there are 4, groups or behaviour patterns. Group A contains all the characters that turn up with 3% probability, namely 'B', 'C', '1' and '2'. and the other groups are set up depending on the probability of encountering the characters: Group B contains the characters 'A', 'E' and '?'. Group C includes 'D' and '$', and finally Group D contains just the SPACE character.

| Character | Chance of occurring | Group | Identifier |
|---|---|---|---|
| SPACE | 54% | A | |
| A | 8% | B | |
| E | 8% | B | |
| ? | 8% | B | |
| $ | 5% | C | |
| D | 5% | C | |
| 1 | 3% | D | 00 |
| 2 | 3% | D | 01 |
| B | 3% | D | 10 |
| C | 3% | D | 11 |

The tree initially starts with one node for each group (4 in total). The nodes are labelled with the number of characters in the group and the probability that one character in the group occurs in a random stream of characters.

To build the tree, there are three possible operations. Where there is an even number of characters in the group, put a node; this node is assigned double the probability, but the counter for the new node shows half the number of characters. The node is assigned a variable "X" of characters, which is filled in later depending on which character in the group is chosen to be compressed. Each time one moves further to the root of the tree a new node is created; the probability is doubled and the number of elements in the counter is halved. When the tree is used to compress data, the "X"s are filled in depending upon which character turns up. Rather than having multiple branching at the top of the tree one has a single track and a small array for an identifier.

E.g., in order to decompress this data the character code is 101011 1 go to left, 0 go to left, 1 go to left. One then knows its B, C, 1 or 2—the last 2 bits tell you which character it is.

Effectively the compressed code comprises two portions; one portion comprises the code which identifies the group, the group code. Again as with Huffman groups which e.g. contain characters which turn up very rarely, have longer group codes than those groups with common characters. The other portion of the compressed code comprises the identifier code which is the code which distinguishes it from other characters within the group. Groups with odd number of characters are split into two groups; one character removed to produce a new group having an even number of characters and a new group containing just one, the removed character.

If there is an odd number of characters in a group, the group is split up into two nodes. One branch represents just one of the characters; the other represents all the other characters and now represents a set having an even number of characters. The improved Huffman trees, at nodes where there is no branching, effectively contain an extra symbol 'X to act as an identifier. Where there is branching from a group having an odd number of members there is an identifier "D" which is either 0 or 1 to indicate which branch is which after the aforementioned splitting, i.e. if the value of "D" is 1 this may represent the branch which represents the character which was removed from the group to provide an even numbered group, and a "0" the new even-numbered group.

The 'D' symbol is used to split the group up into two new groups. Since each new group has its own group identifier, there is no need to assign 0's and 1's to the 'D' symbol.*

The 'X' identifiers in the original and new even groups identifies the character within the even group.

As mentioned the inventor has determined that to optimise efficiency, one can split one node into two nodes, which is indicated using a single digit identifier. In this specification, we refer to this as "D".

The "X"'s and "D"'s are in effect digits of the identifying code and serve to distinguish between any two characters with the same behaviour pattern. The initial step of compression is to label every character with a unique identification number that distinguishes it from other characters with the same behaviour pattern.

The general method of creating a tree for the improved Huffman algorithm is as follows:

Search for the node with the smallest probability. Suppose that this node contains n characters. The next step depends on the value of n:

1) If n is even then create a new node with double the probability but half the number of characters n. Join this new node to the old one, and label the branch with an 'X'.

2) If n is odd and n>1 then create two new nodes with the same probability, the one on the left containing n−1 characters and the one on the right containing 1 character. Join these new nodes to the old node, labelling the branches with a 'D'.

3) If n=1 then search for the node with the second-smallest probability. Suppose that this node contains m characters.

a) If m>1 then create two new nodes with the same probability, one containing m−1 characters and the other containing 1 character. Join these new nodes to the old node, labelling the branches with a 'D'.

b) There is now a node with smallest probability and a node with second-smallest probability, both containing one character. Join these nodes to form a new node containing one character. Label the branch with smallest probability using a '1' and the second-smallest using a '0'. Place the sum of the two probabilities in the new node.

For compression and decompression, each character in a group should be labelled with a unique identification number from the set $\{0,1,2,\ldots\}$. This serves to distinguish between two characters in the same group.

Suppose that the character to be compressed has unique identifier i. Find the correct behaviour pattern on the tree and follow the tree down, taking these steps at each node:

1) If the node has a '0' or '1' branch then add this bit to the string of compressed bits.

2) If the label is 'X' then add the least significant bit of i to the string of compressed bits. Then divide i by 2 (rounded down).

3) For a label 'D' then if i is 0, follow the branch to the right. Otherwise decrease i by 1 and follow the branch to the left.

The resulting string of bits is the compressed character. Decompression is simply a matter of reversing this process, using the compressed bits to follow the tree back up to the correct behaviour pattern. The unique identifier i should be initially set to 0, and is reconstructed by taking the following steps at each node:

1) If the node branches then use the corresponding bit in the compressed string to determine which branch to follow.

2) If an 'X' is reached then multiply i by 2, and then increase i by 1 if the corresponding compressed bit is also '1'.

3) If a left-hand 'D' branch is reached then increase i by 1.

As can be seen, the difference between the two methods is that ordinary Huffman encoding needs a separate node for every character.

Application to Headers

In a particular embodiment of the invention an entire header is treated as a single character.

For 320 bit headers, this means there can be a possible $2^{320}$ different headers. It would be impossible to implement the ordinary Huffman tree in this case. However using the improved Huffman according to the invention all possible headers can be divided up into a substantially reduced number of groups, each group containing headers which have a common behaviour pattern. For example they may be grouped into say 1000 groups, each different group having headers which turn up with the same probability; thus there are 1000 different probabilities that any header might arise. There may be (especially for the less common headers) many million of headers within each probability group. When implementing the improved Huffman method for headers, one groups header probability and these groups are treated as Huffman characters.

EXAMPLE 2

Figure 3:
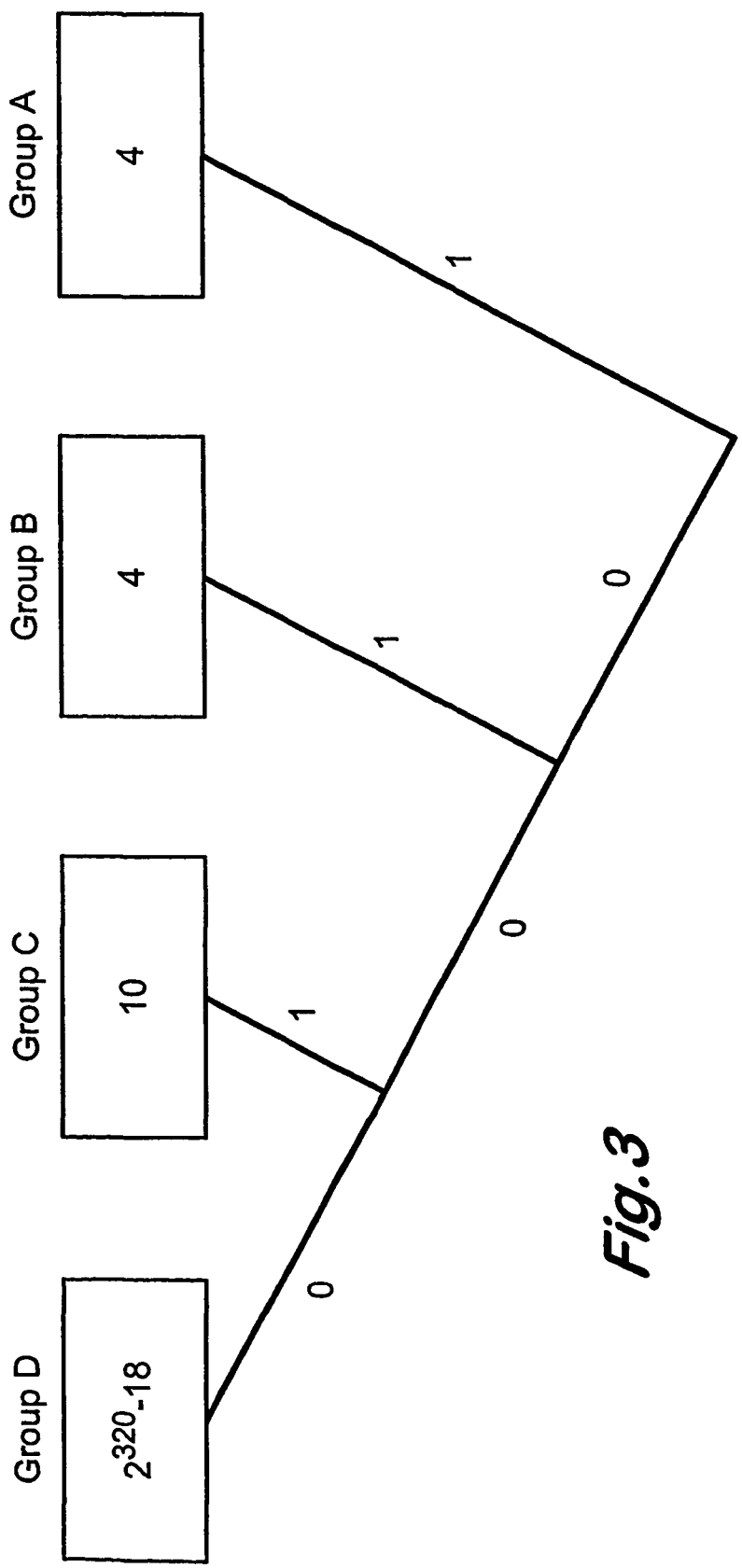
FIG. 3 illustrates an example of the invention and its operational advantages.

FIG. 3 shows an example and illustrates the invention and how its operational advantages arise. A header comprises 320 bits, and can be irregular, i.e. there are 2 to the power 320 possible headers. These are grouped into say 4 behaviour patterns: those which occur with probability A % (say containing 4 headers), those with B % (containing 4 headers) those which occur C % (say 10 headers) and those which occur D % (say this group is irregular and contains the remaining headers i.e. 2 to the power 320−18). The probabilities A to D are in decreasing order. The improved Huffman tree is constructed as in Figure. The group A is represented by a 1, the group B by 01 the group C by 001 and group D by 000. These are the first portion of the compressed headers and effectively are the Huffman codes for the groups. The second portion is the identifier which distinguishes the header from other headers in the same group. In the first group A there are 4 headers so one only needs a identifier register having 2 bits which gives 4 possibilities. The compressed header thus, for member of group A, comprises three bits in total "0" and then the identifier". For group D there are still very many different possibilities of headers 2^ 320−18. In this case it is impossible to have an identifier look up table for each and the header itself becomes the identifier. Thus the complete header becomes 000 tagged onto the header itself. Although the compressed header in this case is actually longer by 3 bits, using this system savings are made because most of the headers which will be encountered are not irregular and thus get compressed with shorter group codes as in Huffman but substantially shorter identifiers.

As a result the tree does not have too be constructed with a node to distinguish each and every possible header which would otherwise become unfeasibly large.

The example describes a simple example where headers are divided into 4 groups. This is an extreme case to illustrate the invention and the number of groups would be selected in an appropriate fashion for optimal efficiency. Typically there may be 1000 groups, but this is still more manageable than 2^320 which is impossible for a computer to deal with In general, with Huffman, the number of characters is a measure of the processing time.

In yet a further preferred embodiment use is made of the fact that the header is divided up into a number of fields. These fields tend to behave independently from each other.

EXAMPLE 3

In a simple example, of a preferred embodiment, one or more of the sub-units may be compressed according to the above described improved Huffman method. The compressed code for the complete header would comprise the cocatenated compressed codes for the sub-units and the sub-units themselves of any sub-unit which isn't compressed.

For example if a header comprises two sub-units, the first sub-unit comprising an address and the second sub-unit a random data string, the overall compressed header will comprise of the compressed address field cocatenated with the random data string.

Note that the fields in the compressed header do not have to occur in the same order as the fields in the uncompressed header.*

The table below shows a typical header; this may contain fields such as IP header, version number, header length, reserved flag, source address destination address, type of service. Each field has a number of different possible behaviours: e.g. the address field is a 32 bit field which indicates the destination of the data packet; very often it is the same as for the last header, e.g. the data packets go to the mobile phone, and only on rare occasions might have switched to a different phone e.g. static (same as the field value in the previous header) alternating (alternate between a small number of values) irregular (completely random—can't be compressed) inferred (can work value out from a different field e.g. length field—how long header is can be worked out by all the other fields). This is shown in the worked example below, which includes a table of a header comprising 3 fields:

| Field 1 | Field 2 | Field 3 |
|---------|---------|---------|
| S/IN    | S/I/A   | S       |

Each field may have one or more different behaviours, In the example the first field can have two different types of behaviour, STATIC or INFERRED, the second field has three possible different types of behaviour STATIC, INFERRED or ALTERNATING and the third field only one STATIC. This is shown in column 2 of the table below.

EXAMPLE 4

A preferred, more complex embodiment will now be described. It is applicable to headers which have fields, wherein one or more field can have different types of behaviours. The first step for each field is to assign one or more different behaviour types. The next step is to determine, for each field, the probability that it will have a particular behaviour type, e.g. for each field determining the probability that it will be STATIC or INFERRED etc. This is shown in the last column of the table below.

In order to determine the number of different groups applied to the improved Huffman method, i.e. the number of different overall header behaviours, one multiplies out the number of different field behaviours for each field. In the example, a field behaviour is picked from field 1, a behaviour from field 2 and a behaviour from field 3. This is then repeated for each combination of field behaviours. This is shown in the second of the tables below. Additionally the probability of each combination is determined as shown in the last column of the second table. The Huffman tree is then arranged such that groups at the top of the Huffman tree, which are the particular combination of header types, are arranged such that those with the smallest probability have the most branching and thus the longest group code and the those with the largest probability of occurring have the shortest branching and group code.

In a further embodiment of this embodiment it is advantageous to keep a register of, for each behaviour pattern, how many ways it can vary. There is, for example, only one way a field can be static i.e. it doesn't change, for an 8 bit field there are 256 ways of being irregular, and perhaps 4 ways of alternating. Knowledge of this allows the size of the identifier code to be determined. Where the field is irregular and there are 256 ways of being irregular the identifier code register need to be 8 bits in size and the identifier code would comprise the field itself. Where the field is alternating between 4 values the identifier register needs to be only two bits in size which allows four different combinations.

|         | Behaviour Number | Behaviour Type | Number of field values exhibiting behaviour | Probability that field will exhibit behaviour |
|---------|------------------|----------------|---------------------------------------------|-----------------------------------------------|
| Field 1 | 1                | STATIC         | 1                                           | 80%                                           |
|         | 2                | INFERRED       | 1                                           | 20%                                           |
| Field 2 | 1                | STATIC         | 1                                           | 80%                                           |
|         | 2                | ALTERNATING    | 4                                           | 15%                                           |
|         | 3                | IRREGULAR      | 256                                         | 5%                                            |
| Field 3 | 1                | STATIC         | 1                                           | 100%                                          |

| Possibility | 1st field | 2nd field | 3rd field | Probability of comb g |
|-------------|-----------|-----------|-----------|-----------------------|
| 1           | S         | S         | S         | 0.8 × 0.8 × 1         |
| 2           | S         | I         | S         | 0.8 × 0.05 × 1        |
| 3           | S         | A         | S         | 0.8 × 0.15 × 1        |
| 4           | N         | S         | S         | 0.2 × 0.8 × 1         |
| 5           | N         | I         | S         | 0.2 × 0.05 × 1        |
| 6           | N         | A         | S         | 0.2 × 0.15 × 1        |

Various methods may be employed in order to arrange for the compression to take place. In a static mode, the scheme is manually programmed to compress one protocol stack with optimal efficiency. The input is a list of the fields within the protocol stack, and for each field a set of possible ways in which the field can behave. This input list is converted into a form suitable for the improved Huffman method, as explained above. The method calculates the best format for the compressed headers and stores the results in the form of a Huffman tree. Alternatively the compressor and decompressor are programmed by sending a special profiling message containing the list of field behaviour patterns. This message is usually sent by the network administrator whenever a new protocol stack needs to be added to the system. A further alternative is a "learning mode" which scans an arbitrary packet stream and dynamically learns how best to compress the packet headers. The efficiency of this mode depends on the number of behaviour types that can be detected. A further preferred embodiment is a "Hybrid Mode" where the system is pre-programmed to compress a protocol stack just as in Static Mode, but Learning Mode is also activated in case the protocol stack can be even more efficiently compressed. This mode is especially useful for coping with unexpected changes in the way the protocol stack behaves.

Generating Byte-Aligned Headers

Certain link layer protocols require all data packets to be a whole number of bytes long. Since the payload is already in this form, this means that the compressed headers must also be byte-aligned. Byte-aligned headers can be generated in two ways. The simplest is to stuff each header with enough bits to round the header up to a whole number of bytes. These extra bits can then be used for CRC checksum or sequence number to protect against lost packets. However, this method is inefficient and tends to randomise the amount of error checking from one header to the next. A better alternative is to always generate byte-aligned headers in the first place. In ordinary Huffman this can be achieved by recursively joining the 256 nodes with smallest probabilities (instead of the 2 nodes with smallest probabilities). Each of the 256 branches is labelled with a different 8-bit pattern. The improved Huffman algorithm can also be modified to generate byte-aligned headers in a similar manner.

The system can also easily handle variable-length fields. In fact, it is simply a matter of adding one behaviour pattern for each possible length of the variable-length field. Note that this encoding implicitly includes the length of the field, so if there is a separate field containing the length value then it should be classed as INFERRED to avoid transmitting the information twice.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method of compressing data, wherein said data is in the form of discrete units, by determining an overall code specific to the units, comprising the steps of:
   a) grouping the units in terms of a common behavior pattern;
   b) for each said group of units, assigning a group specific code, the sizes of said group code being ordered according to the probability of the unit occurring;
   c) assigning a unit identifier code which is specific to identify an individual character within the group, the overall code comprising the concatenated group specific and identifier codes; characterized wherein,
   step c), the identifier code is of the minimum size to allow for each unit which could occur in that group to be assigned specifically;
   said discrete units are is divided into a number of sub-units;
   at least one sub-unit is treated and compressed; and
   the overall compressed code comprises a concatenation of any compressed sub-unit codes and any uncompressed sub-units themselves.

2. A method as claimed in claim 1, wherein the identifier code comprises the data unit itself.

3. A method of compressing data, wherein said data is in the form of discrete units, by determining an overall code specific to the units, comprising the steps of:
   a) grouping the units in terms of a common behavior pattern;
   b) for each said group of units, assigning a group specific code, the sizes of said group code being ordered according to the probability of the unit occurring;
   c) assigning a unit identifier code which is specific to identify an individual character within the group, the overall code comprising the concatenated group specific and identifier codes; characterized wherein,
   step c), the identifier code is of the minimum size to allow for each unit which could occur in that group to be assigned specifically;
   at least one sub-unit is assigned a plurality of behavior types; and
   said groups of units are grouped in terms of having the combination of sub-unit behavior types.

4. A method as claimed in claim 3, wherein the sub-units are grouped according to particular probability ranges that the particular sub-unit will occur.

5. A method according to claim 3, wherein the sub-units are grouped according to at least one of the following types of behavior: static, alternating, inferred or irregular.

6. A method according to claim 3, wherein the number of possible sub-units which could occur in the sub-unit group is determined in order to determine the size of a register for the sub-unit code.

7. A method as claimed in claim 3, wherein the probability of each combination of sub-unit behavior types is determined, each combination forming a separate group.

8. A method as claimed in claim 3, wherein said data unit is a header.

* * * * *